(12) United States Patent
Duqi et al.

(10) Patent No.: US 10,962,431 B2
(45) Date of Patent: Mar. 30, 2021

(54) PRESSURE SENSOR GENERATING A TRANSDUCED SIGNAL WITH REDUCED AMBIENT TEMPERATURE DEPENDENCE, AND MANUFACTURING METHOD THEREOF

(71) Applicant: STMicroelectronics S.R.L., Agrate Brianza (IT)

(72) Inventors: Enri Duqi, Cornaredo (IT); Sebastiano Conti, Pregnana Milanese (IT); Sonia Costantini, Missaglia Lecco (IT)

(73) Assignee: STMICROELECTRONICS S.r.l., Agrate Brianza (IT)

( * ) Notice: Subject to any disclaimer, the term of this patent is extended or adjusted under 35 U.S.C. 154(b) by 4 days.

(21) Appl. No.: 16/220,498

(22) Filed: Dec. 14, 2018

(65) Prior Publication Data

US 2019/0120710 A1  Apr. 25, 2019

Related U.S. Application Data

(62) Division of application No. 14/980,373, filed on Dec. 28, 2015.

(30) Foreign Application Priority Data

Jun. 22, 2015  (IT) .................. 102015000026237

(51) Int. Cl.
| | |
|---|---|
| *G01L 9/00* | (2006.01) |
| *G01L 9/06* | (2006.01) |
| *B81B 7/00* | (2006.01) |
| *B81C 1/00* | (2006.01) |

(52) U.S. Cl.
CPC .......... *G01L 9/0054* (2013.01); *B81B 7/0038* (2013.01); *B81C 1/00285* (2013.01); *G01L 9/065* (2013.01); *B81B 2201/0264* (2013.01); *B81B 2203/0127* (2013.01);
(Continued)

(58) Field of Classification Search
CPC .................. G01L 9/0054; G01L 9/065; B81B 2201/0264; B81B 2203/0127; B81B 2203/0315; B81C 2201/0133; B81C 2203/0145; B81C 1/00285
See application file for complete search history.

(56) References Cited

U.S. PATENT DOCUMENTS

| | | | |
|---|---|---|---|
| 4,744,863 | A | 5/1988 | Guckel et al. |
| 4,766,666 | A | 8/1988 | Sugiyama et al. |
| 6,029,524 | A | 2/2000 | Klauder et al. |

(Continued)

*Primary Examiner* — Seahvosh Nikmanesh
(74) *Attorney, Agent, or Firm* — Seed IP Law Group LLP

(57) ABSTRACT

A pressure sensor designed to detect a value of ambient pressure of the environment external to the pressure sensor includes: a first substrate having a buried cavity and a membrane suspended over the buried cavity; a second substrate having a recess, hermetically coupled to the first substrate so that the recess defines a sealed cavity the internal pressure value of which provides a pressure-reference value; and a channel formed at least in part in the first substrate and configured to arrange the buried cavity in communication with the environment external to the pressure sensor. The membrane undergoes deflection as a function of a difference of pressure between the pressure-reference value in the sealed cavity and the ambient-pressure value in the buried cavity.

20 Claims, 7 Drawing Sheets

(52) U.S. Cl.
CPC ............... *B81B 2203/0315* (2013.01); *B81C 2201/0133* (2013.01); *B81C 2203/0145* (2013.01)

(56) References Cited

U.S. PATENT DOCUMENTS

| | | |
|---|---|---|
| 6,229,190 B1 | 5/2001 | Bryzek et al. |
| 6,388,279 B1 | 5/2002 | Sakai et al. |
| 6,559,487 B1 | 5/2003 | Kang et al. |
| 6,591,687 B1 | 7/2003 | Bjoerkman et al. |
| 7,111,518 B1 | 9/2006 | Allen et al. |
| 7,622,782 B2 | 11/2009 | Chu et al. |
| 8,049,287 B2 | 11/2011 | Combi et al. |
| 8,173,513 B2 | 5/2012 | Villa et al. |
| 8,384,168 B2 | 2/2013 | Hooper et al. |
| 10,809,140 B2 * | 10/2020 | Duqi .................. G01L 9/065 |
| 2006/0081042 A1 | 4/2006 | Silverbrook et al. |
| 2008/0315333 A1 | 12/2008 | Combi et al. |
| 2009/0235753 A1 | 9/2009 | Yamamoto et al. |
| 2010/0230766 A1 | 9/2010 | Elian et al. |
| 2011/0031567 A1 | 2/2011 | Corona et al. |
| 2012/0012949 A1 | 1/2012 | Winkler et al. |
| 2013/0000411 A1 | 1/2013 | Robert et al. |
| 2014/0023564 A1 * | 1/2014 | Rothacher .............. B29C 66/61 |
| | | 422/502 |
| 2014/0338459 A1 | 11/2014 | Besling et al. |

\* cited by examiner

US 10,962,431 B2

PRESSURE SENSOR GENERATING A TRANSDUCED SIGNAL WITH REDUCED AMBIENT TEMPERATURE DEPENDENCE, AND MANUFACTURING METHOD THEREOF

BACKGROUND

Technical Field

The present disclosure relates to a pressure sensor in which the transduced pressure signal has a reduced ambient temperature dependence and to a manufacturing method thereof.

Description of the Related Art

As is known, a pressure transducer or sensor is a device that converts a variation of pressure into a variation of an electrical quantity (a resistance or a capacitance). In the case of a semiconductor sensor, the pressure variation is detected thanks to the presence of a membrane (or diaphragm) of semiconductor material that overlies a cavity and is able to undergo deflection in the presence of a force acting thereon. Deflection of the membrane is measured, for example, by piezoresistive elements constrained to the membrane itself (i.e., on the basis of the capacity of some materials to modify their resistivity as a function of the deflection to which they are subjected).

Piezoresistors are normally provided on the edge of the suspended membrane and/or are connected together in Wheatstone-bridge configuration. Application of a pressure causes a deflection of the membrane, which in turn generates a variation of the offset voltage of the bridge. By detecting the variation of voltage with an appropriate electronic circuit it is thus possible to obtain the desired pressure information.

Pressure sensors typically include a cavity in one side of the flexible membrane to enable deflection of the latter. This cavity forms a pressure reference and is provided so that said pressure reference is vacuum pressure. In this way, the membrane is under the influence of an absolute pressure. This type of pressure sensor finds wide application in the vacuum-technology industry, in space applications, and in all the sectors in which it is of interest to measure an atmospheric pressure with respect to an absolute reference that is minimally dependent upon external environmental conditions (e.g., the working temperature of the sensor itself).

However, production of an absolute pressure sensor involves high-precision technological processes in order to couple the membrane perfectly on the cavity in vacuum conditions.

Currently, various solutions have been proposed for manufacture of pressure sensors, amongst which: use of silicon-in-insulator (SOI) substrates; wet etching from the front (see for example U.S. Pat. No. 4,766,666); wet etching from the back; and other methods still (see, for example, U.S. Pat. No. 4,744,863).

In all of the known aforementioned solutions, use of semiconductor technology for providing cavities underneath suspended structures and layers involves processes that are complex, costly, and in some cases scarcely compatible with the current steps used in the semiconductor industry for manufacture of integrated circuits.

FIG. 1 is a lateral sectional view of a pressure sensor 10 of a known type, which provides a solution to the problems set forth above. According to the embodiment of FIG. 1, a membrane 1 extends in one upper side 5a of a wafer of semiconductor material 5, for example silicon. The membrane 1 is suspended over a buried cavity 2, which is formed according to the manufacturing method described in U.S. Pat. No. 8,173,513.

The steps for obtaining the buried cavity 2, described in U.S. Pat. No. 8,173,513, envisage a high-temperature processing of the wafer 5, in an environment at controlled pressure (but not vacuum pressure). Following upon closing of the cavity 2 (completion of the formation of the overlying membrane 1), the wafer 5 is then cooled, thus generating a reduction of the pressure inside the buried cavity 2. However, during use of the sensor 10 thus obtained, an increase in the temperature of the environment in which the sensor 10 operates causes a consequent increase in the pressure inside the buried cavity 2. A variation of the absolute reference pressure provided by the pressure inside the buried cavity 2 leads to a variation of the transduced output signal of the sensor 10 also in the absence of a variation of the ambient pressure to be measured. These variations of the output signal may, at least in part, be compensated for during a step of processing of the output signal but are, however, undesirable.

BRIEF SUMMARY

Some embodiments of the disclosure are a pressure sensor with reduced dependence upon the temperature of the transduced signal, and a manufacturing method thereof that will overcome the disadvantages of the known solutions.

According to the present disclosure a pressure sensor and a manufacturing method thereof are provided.

BRIEF DESCRIPTION OF THE SEVERAL VIEWS OF THE DRAWINGS

For an understanding of the present disclosure preferred embodiments thereof are now described, purely by way of non-limiting example, with reference to the attached drawings, wherein.

DETAILED DESCRIPTION

Figure 1:
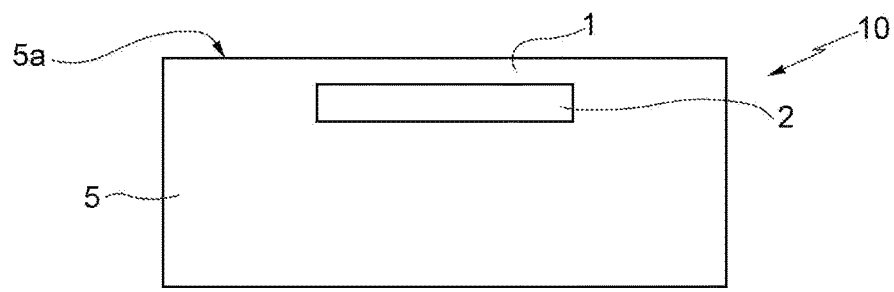
FIG. 1 shows a cross-section of a pressure sensor of a known type.
Figure 2:
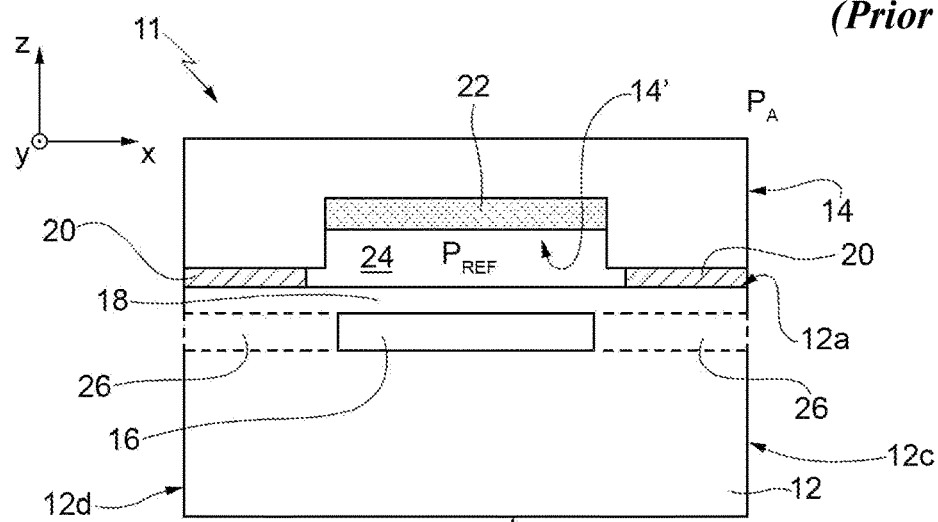
FIGS. 2 and 3 show in lateral sectional view and in top plan view, respectively, a pressure sensor according to one embodiment of the present disclosure.

FIG. 2 shows a lateral sectional view of a pressure transducer or sensor 11, obtained in MEMS technology, according to one aspect of the present disclosure. The cross-section of FIG. 2 is represented in a system of mutually orthogonal Cartesian axes X, Y, and Z, and is taken along a line of section shown in FIG. 3. The pressure sensor 11 comprises a body including a substrate 12, of semiconductor material, such as silicon, coupled to a cap 14, which is also of semiconductor material, such as silicon. The substrate 12 has a first face 12a and a second face 12b, opposite to one another, along the axis Z. A cavity 16 extends within the substrate 12, separated from the first face 12a by a thin portion of the substrate 12, which forms a membrane 18 suspended over the cavity 16. The membrane 18 has a thickness, along the axis Z, comprised between 4 and 40 µm, for example 6 µm.

The cavity 16 has a thickness, along the axis Z, smaller than the thickness, along Z, of the substrate 12. In other words, the cavity 16 extends buried within the substrate 12, between the first and second faces 12a, 12b. According to one embodiment, the cavity 16 has, in a view in the plane XY, a circular or polygonal shape, for example square with side of 350 µm. Along Z, the cavity 16 has a depth comprised between 1 and 6 µm, for example 4 µm.

The cap 14 is coupled to the first face 12a of the substrate 12 in peripheral regions of the membrane 18, by a coupling region 20. Since the coupling region 20 is arranged in peripheral portions of the membrane 18, during use the membrane 18 is free to undergo deflection and not undergo interference caused by the presence of the coupling region 20. The coupling region 20 extends along the entire perimeter of the membrane 18 and is, for example, of a glass-frit type. Other types of bonding may be used, such as for example metal bonding (e.g., gold-gold), eutectic bonding (e.g., Al—Ge).

The cap 14 has a recess 14' directly facing the membrane 18. The recess 14' houses a getter layer 22. The getter layer 22 has the function of generating, in use and when the recess 14' is sealed (i.e., when the cap 14 is coupled to the substrate 12 by the coupling region 20), a reference pressure $P_{REF}$ within the recess 14' different from (in particular, lower than) the pressure $P_A$ present in the environment outside the recess 14'. Materials used as getter layer 22 are known and comprise, for example, metals such as aluminum (Al), barium (Ba), zirconium (Zr), titanium (Ti), vanadium (V), iron (Fe), or corresponding mixtures or alloys, such as zirconium-aluminum, zirconium-vanadium-iron, zirconium-nickel, AND zirconium-cobalt (in particular, an alloy of Zr/Co/O). The getter layer 22 is, according to one embodiment, of a non-evaporable-getter (NEG) type, provided in the form of layer on the exposed surface of the recess 14', in a manufacturing step prior to the step of coupling of the cap 14 to the substrate 12. As is known, during the step of formation of the getter layer 22, the material of which the getter layer 22 is made reacts with the surrounding air, causing formation of a passivating layer (typically of oxide or oxide/nitride) that coats the surface area of the getter layer 22 completely, rendering it inactive. Activation of the getter layer 22 occurs (following upon hermetic sealing of the recess 14') by local activation in temperature in order to remove the passivating layer that has formed on the surface of the getter layer 22. In this way, the getter layer 22 is activated and operates in a known way by reacting with residual gases within the recess 14' and enabling a reduction of the reference pressure $P_{REF}$ with respect to the ambient pressure $P_A$. The reference pressure $P_{REF}$ represents the vacuum pressure.

It is evident that the getter layer 22 may be omitted in the case where the step of sealing of the recess 14' takes place at controlled atmosphere and pressure. The extension of the recess 14' along the axes X, Y, and Z is chosen so to generate, after coupling of the cap with the substrate 12, a reference cavity 24 with a volume comprised between 1e-13 $m^3$ and 50e-13 $m^3$, for example 10e-13 $m^3$. The pressure $P_{REF}$ inside the reference cavity 24 is the reference pressure for measurement of the absolute pressure by the pressure sensor 11. It is consequently important for the coupling region 20 to seal the reference cavity 24 hermetically, preventing any exchange with the external ambient pressure $P_A$. In use, i.e., following upon activation of the getter layer 22 or following upon the step of sealing of the recess 14' should the sealing take place at controlled atmosphere and pressure, the reference pressure $P_{REF}$ inside the reference cavity 24 has a value of approximately 0 mbar when measured at an ambient temperature of approximately 25° C.

The pressure inside the cavity 16 is, in use, equal to the ambient pressure $P_A$ to be measured. For this purpose, the cavity 16 is fluidically coupled to the environment external to the pressure sensor 11 so that its internal pressure stabilizes at the ambient pressure $P_A$ (in this context, and in the following description, the fluid considered is air). For this purpose, according to one aspect of the present disclosure, the substrate 12 has one or more channels 26 (two channels 26 are illustrated in FIG. 2, with a dashed line in so far as they are not visible along the line of section of FIG. 3), which connect the cavity 16 with the environment external to the pressure sensor 11. The channels 26 are thus through holes provided in the substrate 12.

According to the embodiment of FIG. 2, the channels 26 have: a main extension along the axis X, for example of 100 µm; a thickness, along Z, equal to the thickness, along Z, of the cavity 16, for example of 4 µm; and a dimension along Y for example of 10 µm. The dimension along Y of the channels 26 is smaller than the corresponding dimension of the cavity 16 in order not to generate undesirable structural weaknesses of the substrate 12.

According to one embodiment, the dimension of the channels 26 along Y is not constant, but is greater in the proximity of lateral faces 12c, 12d of the substrate 12 (which is shaped substantially like a squeezed funnel, or has a squeezed frustoconical shape, where the opening with smaller area directly faces the cavity 16, and the opening with larger area faces the outside of the pressure sensor 11). In this way, any possible obstruction of the channels 26 by material deriving from outside the substrate 12, for example during a dicing step for formation of the dice that integrate the pressure sensor 11, is prevented.

The channels 16 are formed, for example, during the same steps of creation of the cavity 16 and using the same manufacturing process (for example, the one described in U.S. Pat. No. 8,173,513).

In this way, the cavity 16 is fluidically connected with the external environment, and the pressure inside the cavity 16 is the ambient pressure $P_A$ to be measured.

Figure 3:
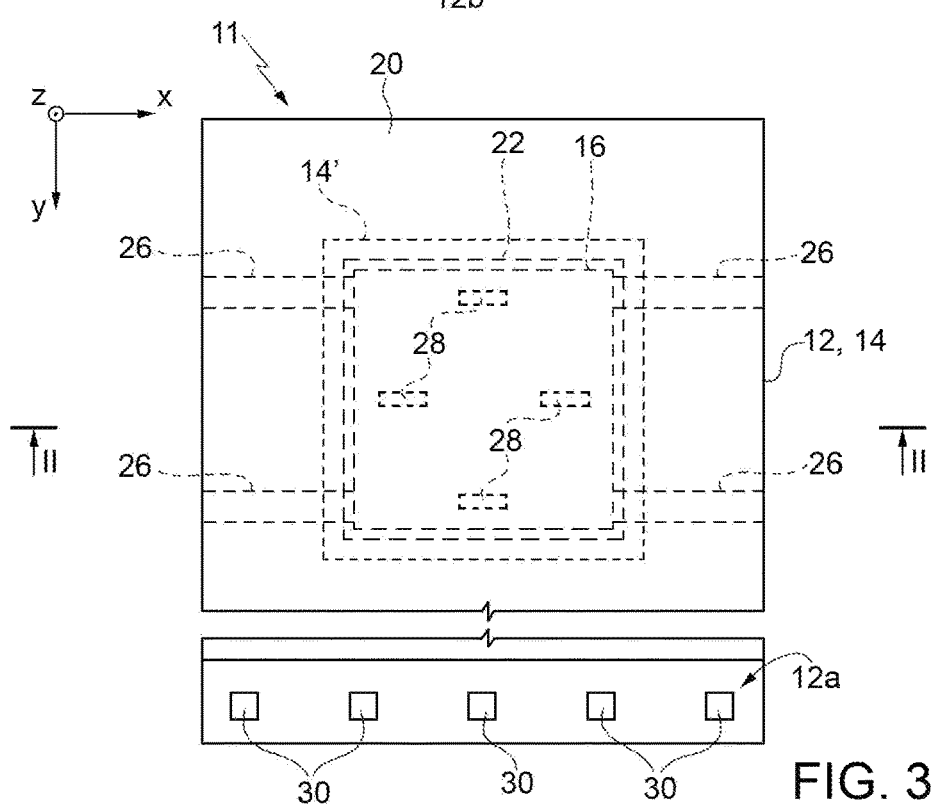

FIG. 3 is a top plan view of the pressure sensor 11 of FIG. 2, in the plane XY. As may be more fully appreciated from FIG. 3, according to this embodiment, four channels 26 are present that branch off symmetrically from respective regions of the cavity 16 and connect the latter with the outside of the sensor 11.

The membrane 18 further has one or more piezoresistive elements 28 arranged in peripheral regions of the membrane 18 and facing the inside of the reference cavity 24. In other words, the piezoresistive elements 28 are formed in regions of the face 12a that, at the end of the manufacturing steps, are contained within the reference cavity 24. The piezoresistive elements 28 may be protected by a thin layer of dielectric (e.g., silicon nitride with a thickness of approximately 0.5 µm, or less) or else may face, or be exposed directly towards, the inside of the reference cavity 24. In this case, since the reference cavity functions as protection for the piezoresistive elements 28, they are not subject to deterioration caused by atmospheric agents present in the environment in which the pressure sensor 11 operates. Consequently, it is not necessary to provide a layer of protection of the piezoresistive elements 28, with the advantage that these piezoresistive elements 28 are effectively housed in surface portions of the membrane 18, which are more subject to stress during use. The sensitivity of the pressure sensor 11 is thus improved.

According to one embodiment, the piezoresistive elements are provided as regions of a P type, formed by implantation of dopant atoms on the side 12a of the substrate 12, whereas the portion of the substrate 12 that forms the membrane is of silicon with a doping of an N type. In FIG. 3 four piezoresistors 28 are present, electrically connected together in Wheatstone-bridge configuration. The interconnections between the piezoresistors 28 (e.g., metal regions extending over an insulating layer), albeit present, are not represented in the figure exclusively for simplicity of representation. As an alternative to what has been said, the piezoresistors 28 may be made polysilicon, for example with a doping of a P type, deposited on the membrane 18. A plurality of contact pads 30 extend in an area of the pressure sensor external to the membrane 18 and to the coupling region 20. The contact pads 30 are of conductive material, such as metal, and form an interface for electrical connection with the outside of the sensor, for example for acquiring the transduced signal supplied at output by the Wheatstone-bridge circuit formed by the piezoresistors 28.

Figure 4:
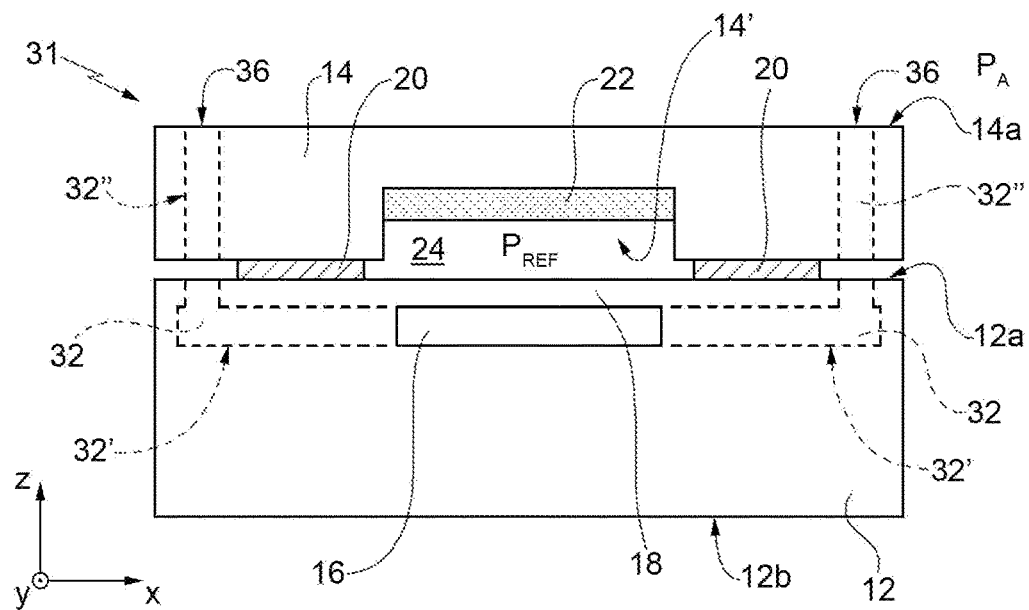
FIGS. 4 and 5 show in lateral cross-sectional view and in a top plan view, respectively, a pressure sensor according to a further embodiment of the present disclosure.
Figure 5:
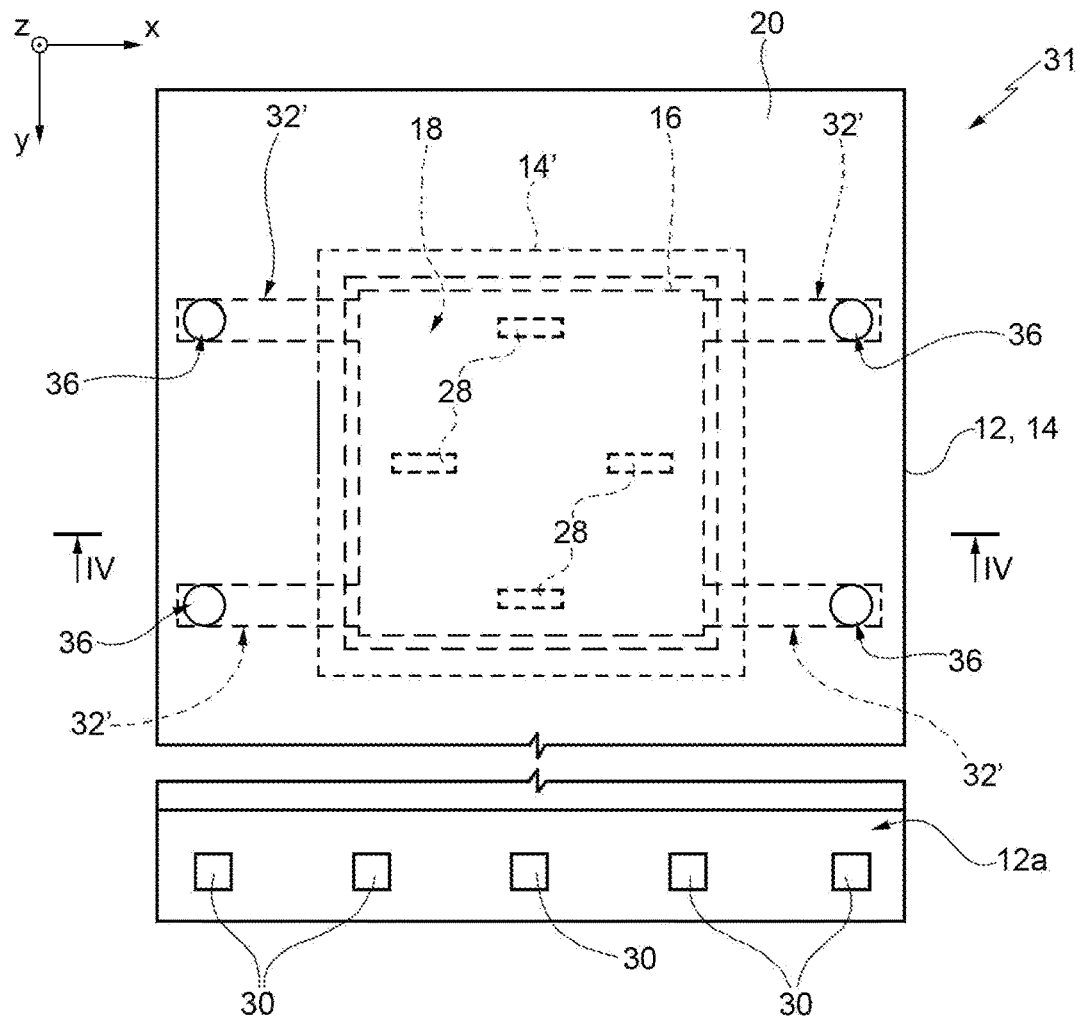

As is known, during the production processes, formed on a wafer of semiconductor material are a plurality of pressure sensors 11 of the type illustrated in FIGS. 2 and 3. A final processing step envisages dicing for forming dice, each of which houses a respective pressure sensor 11. In the case where the channels 26 are formed during the same step of formation of the cavity 16, it may happen that, during dicing, one or more of the channels 26 is occluded by waste material deriving from the dicing step itself. This effect is, obviously, undesirable. In order to overcome this drawback, one embodiment of the present disclosure envisages that the channels for connecting the cavity 16 with the outside are provided at the top, in the area of the cap 14. This embodiment is illustrated in FIGS. 4 and 5. FIG. 4 is, in particular, a cross-sectional view of the pressure sensor of FIG. 5, taken along the line of section V-V of FIG. 5.

With reference to FIG. 4, a pressure sensor 31 is illustrated in lateral section. Elements of the pressure sensor 31 that are in common with those of the pressure sensor 11 of FIG. 2 are designated by the same reference numbers and are not described herein any further. One or more channels 32 (two channels 32 are represented with a dashed line in FIG. 4, in so far as they are not visible along the line of section V-V), which have, in cross-sectional view in the plane XZ, the shape of an L or a T turned upside down, extend in the substrate 12 starting from the cavity 16, in fluidic connection with the cavity 16. A first portion 32' of each channel 32 extends along the axis X as partial prolongation of the cavity 16 (the first portion 32' is similar to the channels 26 of FIGS. 2 and 3), whereas a second portion 32" of each channel 32 extends along the axis Z starting from the first portion 32' through the face 12a of the substrate 12, and completely through the cap 14. In this way, openings 36 are provided, fluidically connected with the cavity 16, on an upper surface 14a of the cap 14, exposed towards the external environment and thus at the pressure $P_A$ to be measured. The second portions 32" of the channels 32 are formed, for example, by anisotropic etching such as deep reactive ion etching (DRIE), whereas the first portions 32' of the channels 32 are formed, for example, during the same step of formation of the cavity 16 (for instance, according to the process described in U.S. Pat. No. 8,173,513), or using some other technique.

FIG. 5 shows, in a top plan view in the plane XY, the pressure sensor of FIG. 4. As may be noted from FIG. 5, four openings 36 are present at the front of the pressure sensor 31, formed laterally with respect to the coupling region 20.

Figure 6:
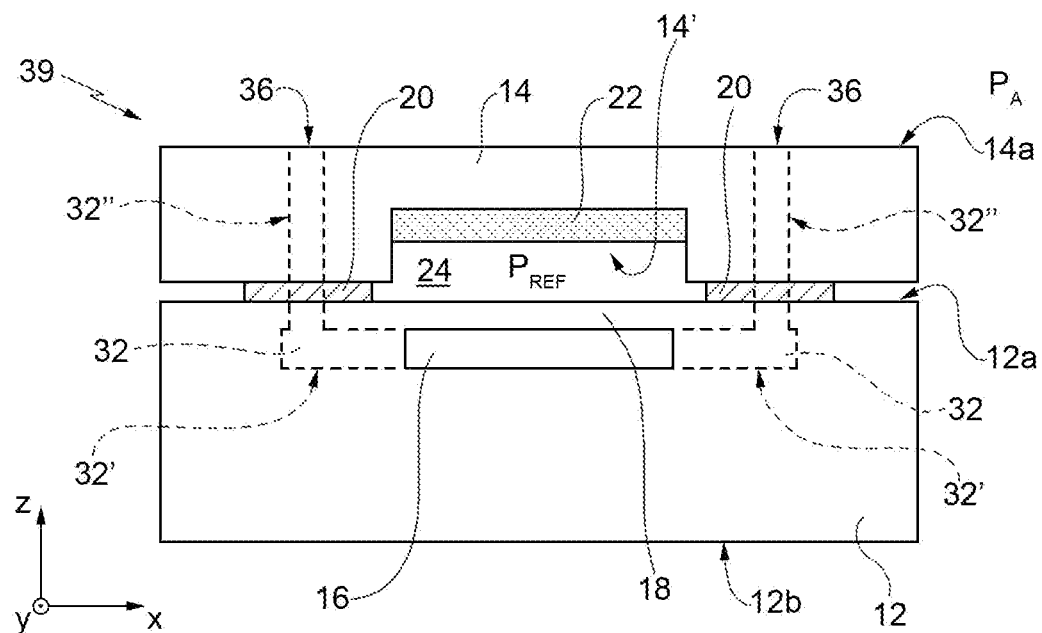
FIG. 6 shows in lateral sectional view a pressure sensor according to a further embodiment of the present disclosure.

According to the embodiment of FIGS. 4 and 5, the second portions 32" of the channels 32 extend outside the coupling region 20. According to a further embodiment, illustrated in FIG. 6, a pressure sensor 39 comprises second portions 32" of the channels 32 that extend through the coupling region 20. In this case, during the step of formation of the coupling region 20, through openings 40 may be provided in portions of the coupling region 20 in which a respective second portion 32" of a respective channel 32 will be formed.

Figure 7:
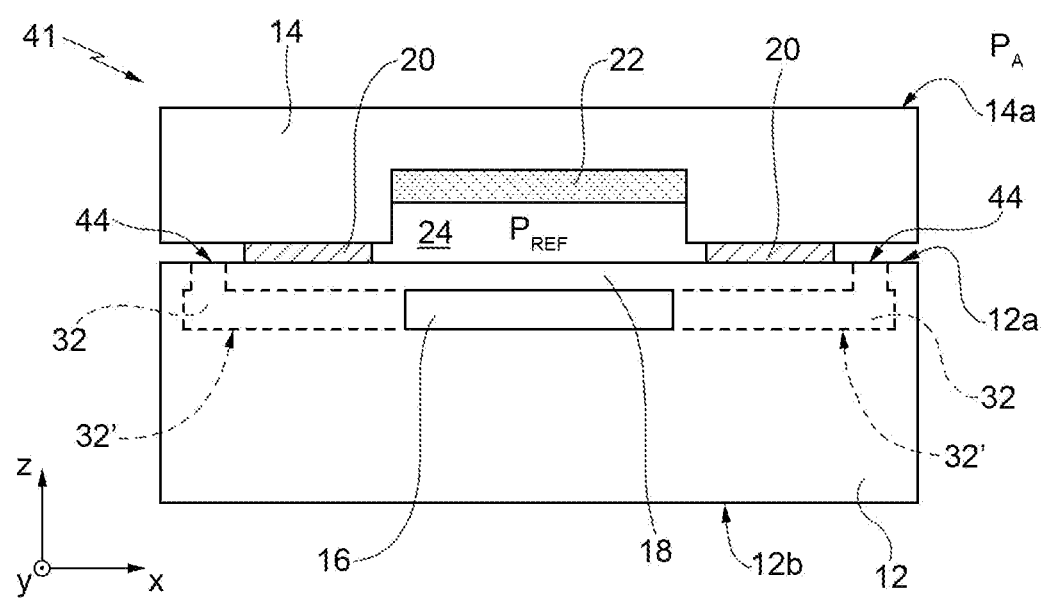
FIG. 7 shows in lateral sectional view a pressure sensor according to a further embodiment of the present disclosure.

According to a further embodiment, illustrated in FIG. 7, a pressure sensor 41 comprises channels 32 that extend exclusively in the substrate 12 (and not also through the cap 14). In this case, openings 44 for fluidic access towards the cavity 16 are provided on the face 12a of the substrate 12, laterally with respect to the coupling region 20 and outside the reference cavity 24. According to this embodiment, formation of the channels 32 is carried out prior to the steps of formation of the coupling regions 20 and of coupling between the substrate 12 and the cap 14. In order to prevent the step of formation of the coupling region 20 from causing an undesirable obstruction of the channels 32 thus formed, it is expedient to provide the channels 32 at a sufficient distance from the portions of the face 12a in which the coupling region 20 is to be formed, for example at a distance, measured along the axis X, of 100 μm in the case of glass frit (in the case of use of some other bonding techniques, for example metal bonding, this distance may be different, either smaller or greater). In order to prevent the material used for the glass frit from expanding on the surface 12a of the substrate 12 in an undesirable way, there may be provided containment regions for example in the form of trenches (not illustrated) obtained by etching selective portions of the surface 12a, alongside the surface area in which the coupling region 20 is to be formed.

Described in what follows is a method for manufacturing the pressure sensor of FIGS. 2 and 3.

Figure 8A:
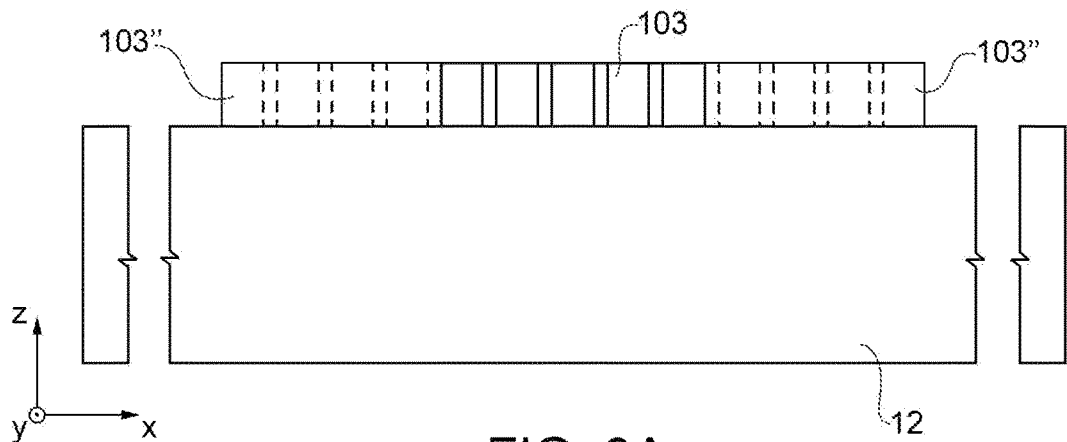
FIG. 8A-14 show, in lateral sectional view, manufacturing steps of the pressure sensor of FIGS. 2 and 3.
Figure 8B:
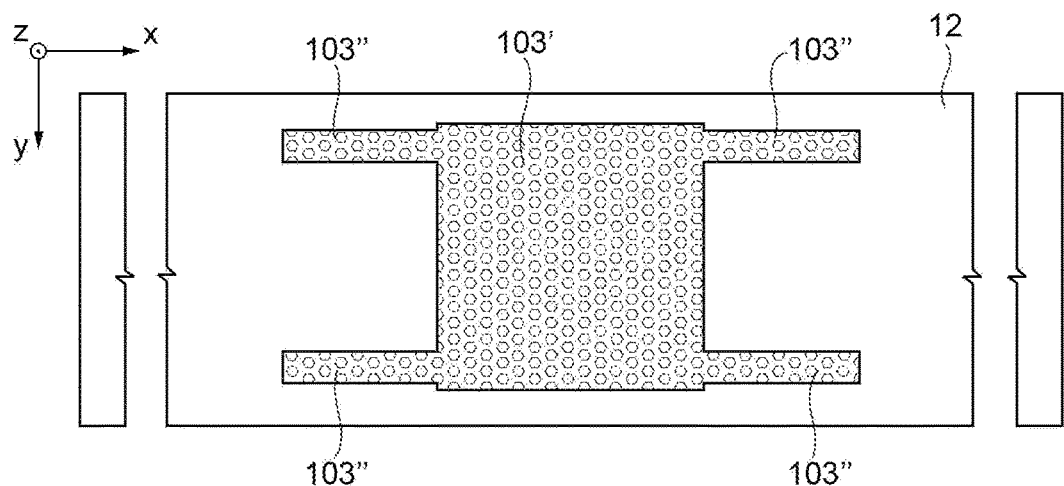
Figure 8C:
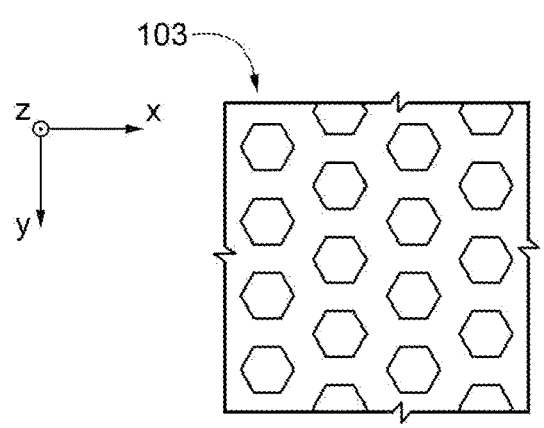

FIG. 8A is a cross-sectional view of a semiconductor wafer, made in particular of monocrystalline silicon, during an initial step of manufacture of the pressure sensor 11. With reference to FIG. 8A, the semiconductor wafer comprises a substrate 12 of an N type. Provided on the surface of the substrate 12 is a resist mask 103. As may be seen in FIG. 8B (which shows a qualitative top plan view, not in scale, of the wafer of FIG. 8A), the mask 103 has a circular or generically polygonal sensor area 103' (for example, square, as illustrated in FIG. 8B), and likewise has elongated regions 103" that depart from the sensor area 103' and define, as regards shape and dimensions, the channels 26 that are to be formed. The mask 103 defines a honeycomb lattice (as may be noted more clearly from the enlarged portion of FIG. 8C), which presents mask regions of a hexagonal shape arranged up close to one another.

Using the mask 103 (FIG. 9), etching of the substrate 12 is carried out to form a trench 106, which has a depth of some microns, for example approximately 10 μm, and defines silicon columns 107 that are the same as one another and have a shape corresponding to the shape of the honeycomb regions defined by the mask 103. Likewise illustrated in FIG. 9 (with a dashed line) are trenches 108 that will lead, in subsequent processing steps, to formation of the channels 26.

Figure 10:
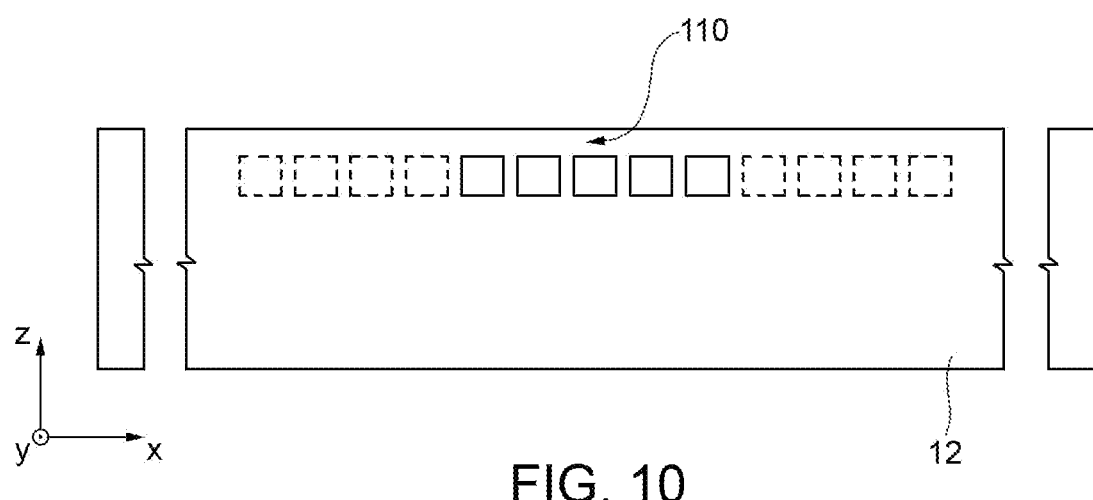

Next (FIG. 10), the mask 103 is removed and an epitaxial growth is carried out in deoxidizing environment (typically, in atmosphere that presents a high concentration of hydrogen, preferably using trichlorosilane—$SiHCl_3$). Consequently, an epitaxial layer 110 (hereinafter not distinguished from the substrate 12 and designated by the same reference number 12), of an N type, grows above the silicon columns 107 and closes the trench 106 at the top, trapping the gas present therein (here, molecules of hydrogen—$H_2$). The thickness of the epitaxial layer 110 is of some microns, for example between 1 and 40 μm.

Figure 11:
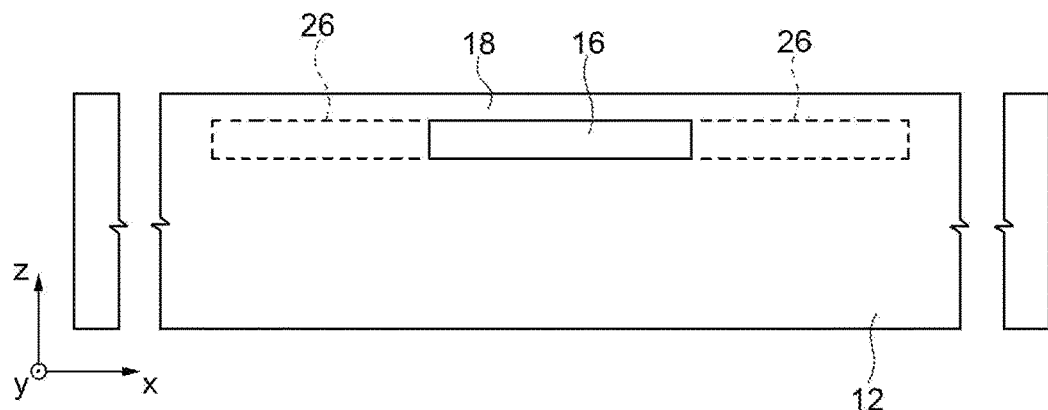

An annealing step is then carried out, for example for 30 minutes at 1190° C. The annealing step causes (FIG. 11), in a per se known manner, a migration of the silicon atoms, which tend to move into the position of lower energy. Consequently, in the area of the trenches 106 and 108, where the silicon columns are arranged close to one another, the silicon atoms migrate completely and form, respectively, the cavity 16, closed at the top by the membrane 18, and the channels 26, which are also closed at the top by the silicon regions alongside the membrane 18. Owing to the presence of the cavity 16, the membrane 18 is flexible and may undergo deflection.

Preferably, annealing is carried out in an $H_2$ atmosphere for preventing the hydrogen present in the trench 106 from escaping through the epitaxial layer 110 outwards and for increasing the concentration of hydrogen present in the cavity 16 and in the channels 26, in the case where the hydrogen trapped during the step of epitaxial growth were not sufficient. Alternatively, annealing may be carried out in nitrogen environment.

Next, in a way not illustrated in the figure, selective portions of the membrane 18 are doped via implantation of dopant species of a P type, for example boron, in order to provide the piezoresistive elements 28. The step of formation of piezoresistors in selective portions of a membrane, as likewise their Wheatstone-bridge connection, is per se known and is thus not described herein any further.

If so desired, it is possible to integrate electronic components, constituting the control circuitry of the pressure sensor 11, and/or electrical contact pads (e.g., the pads 30 of FIG. 3) within the substrate 12, in regions external to the membrane 18, in a per se known manner that does not form the subject of the present disclosure.

Figure 12:
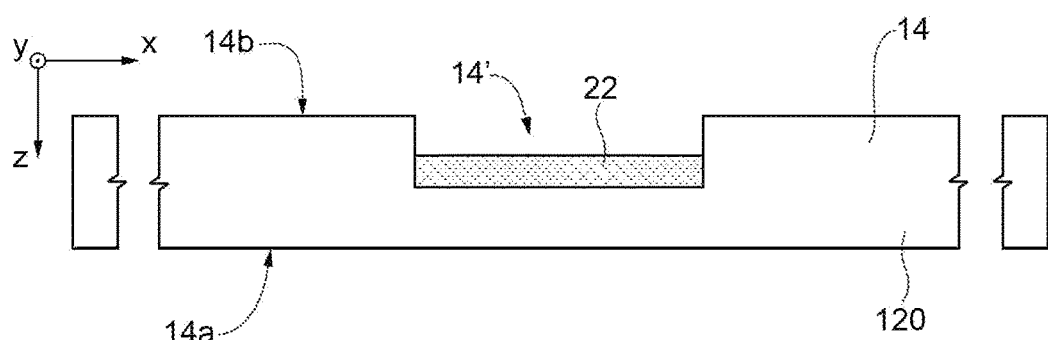

Then (FIG. 12), a wafer is laid, having a substrate 120, in which the cap 14 is to be provided. For this purpose, the substrate 120 is etched on a face 14b thereof to form the recess 14', which extends in depth into the substrate 120 for a thickness smaller than the thickness of the substrate 120 itself. The recess 14' has dimensions, in the plane XY, such that, when the cap 14 is coupled to the substrate 12, the recess 14' is designed to surround the membrane 18 and the piezoresistors 28 completely. Formed within the recess 14', as already described previously, is the getter layer 22, in a per se known manner.

Figure 13:
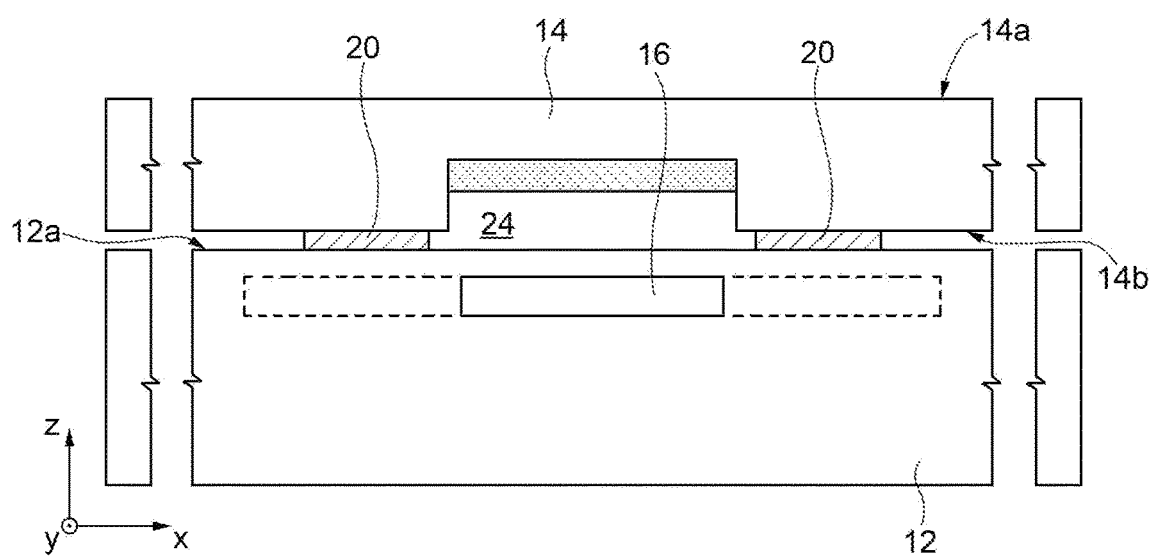

Next, as illustrated in FIG. 13, the wafer comprising the substrate 12 (in the processing step of FIG. 11) and the wafer comprising the substrate 120 (in the processing step of FIG. 12) are coupled together (step known as "wafer-to-wafer bonding") to form the coupling regions 20, for example by the glass-frit technique, so that the recess 14' faces, and completely surrounds, the membrane 18 (and the piezoresistors 28 integrated in the membrane 18). Preferably, the coupling regions 20 extend, on the face 12a of the substrate 12, so to not project laterally (i.e., along X) with respect to the channels 26. In this way, a subsequent dicing step is carried out exclusively through supports of semiconductor material (the cap 14 and the substrate 12), and not also through the coupling regions 20, which could be of a material not compatible with the dicing tools used.

Finally (FIG. 14), the wafer is cut, along dicing lines 53, into dice, each containing a respective pressure sensor 11 thus obtained.

Figure 9:
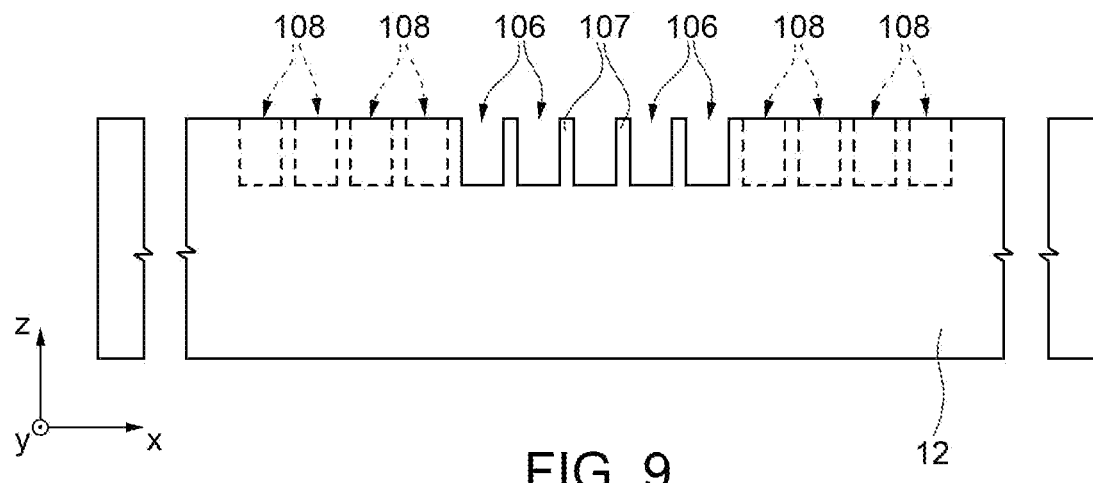
Figure 14:
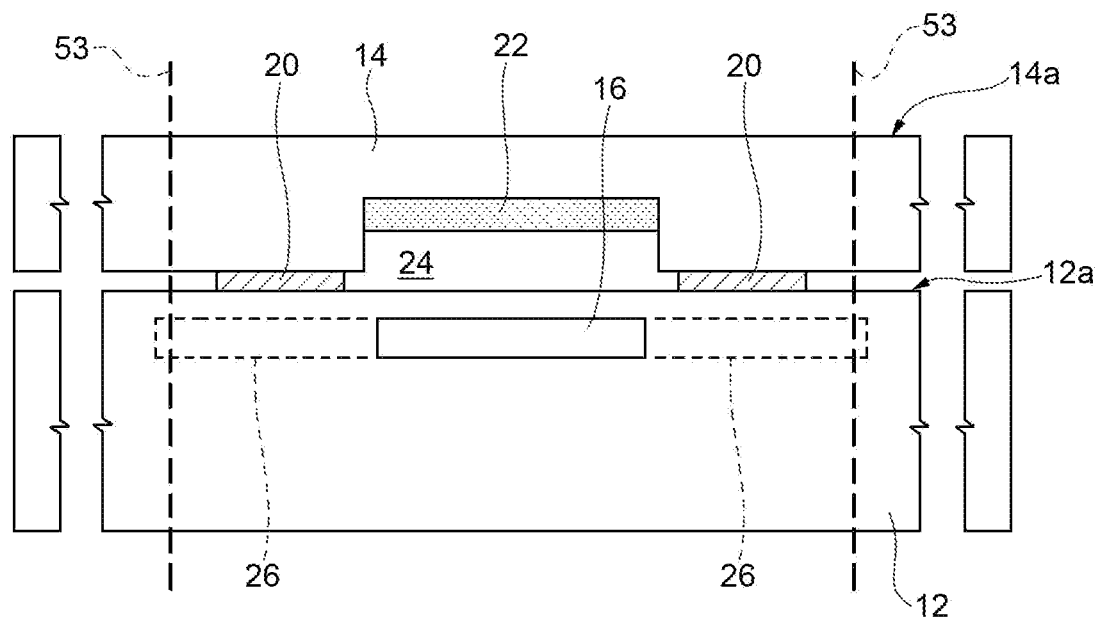
Figure 15:
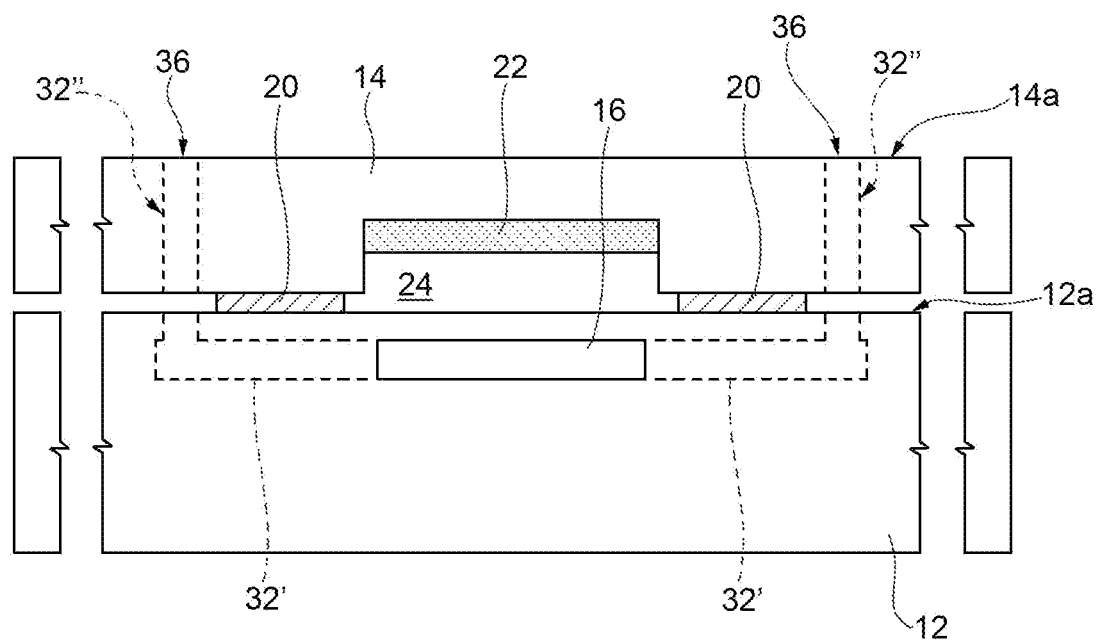
FIG. 15 shows an intermediate manufacturing step for obtaining the pressure sensor of FIGS. 4 and 5.

In order to manufacture the pressure sensor 31 of FIGS. 4 and 5, after the step of FIG. 13, step of FIG. 15 is envisaged, in which a DRIE step is carried out (using an appropriate mask, not illustrated) on top regions of the cap 14 aligned, along Z, with respective portions of the channels formed during the step of FIG. 9. The second portions 32" of the channels for access to the cavity 16 are thus formed (which, in FIG. 15, are represented with a dashed line in so far as they are not visible along the line of section VIII-VIII of FIG. 8B). Then the dicing step of FIG. 14 is carried out.

Appropriate alignment markers may be envisaged, in a per se known manner, in order to facilitate identification of the top regions of the cap 14 aligned, along Z, with respective portions of the channels formed during the step of FIG. 9.

The advantages that may be achieved with the pressure sensor described emerge clearly from the foregoing description.

In particular, the transduced pressure signal, generated at output from the pressure sensor according to any one of the embodiments described, does not depend upon the residual pressure that is present in a buried cavity. In fact, the reference pressure is now given by the pressure present in a cavity obtained by a process of coupling of substrates, which may be controlled with high precision (for example, using a getter layer). The reference pressure, according to the present disclosure, does not vary, or varies minimally, with the temperature of the environment in which the pressure sensor works.

Furthermore, since the transducer elements (piezoresistors) face the inside of the reference cavity (which is hermetically closed), they are immune from any impurities and atmospheric agents (dust, humidity, etc.) that might damage them or generate variations of the signal transduced thereby that are unforeseeable and may not be compensated for.

Finally, thanks to the manufacturing process described, the pressure sensor of silicon has a low cost and reduced dimensions, as well as an improved resistance to failure. In fact, since the cavity that receives the ambient pressure is of a buried type, to obtain it no further step of coupling between substrates is required.

Finally, it is clear that numerous modifications and variations may be made to the pressure sensor described and illustrated herein, all of which fall within the scope of the inventive idea, as defined in the annexed claims.

For instance, the transduced signal generated as a function of deflection of the membrane 18 may be generated by a capacitive coupling of conductive regions of the membrane 18 with a fixed reference electrode. The conductive regions of the membrane 18 comprise, for example, a thin metal layer, formed by deposition techniques of a known type. In this case, the piezoresistive elements are not necessary, and the cavity 24 further houses the fixed reference electrode; the latter faces the conductive regions of the membrane 18 so that the fixed reference electrode and the membrane 18 form respective plates of a capacitor. In use, deflection of the membrane causes a variation of the capacitance of the capacitor thus formed. The measurement of said variation of capacitance may be correlated to the deflection of the membrane 18 which in turn may be correlated to the ambient pressure $P_A$ acting thereon. The ambient pressure $P_A$ may thus be measured.

Furthermore, the channel for connecting the cavity 16 with the external environment may be formed for connecting the cavity 16 with the face 12b of the substrate 12, by providing fluidic access openings on said face 12b. The process of formation of said openings is similar to the process already described with reference to FIGS. 4 and 5 (e.g., DRIE of the substrate 12 starting from the face 12b).

The various embodiments described above can be combined to provide further embodiments. All of the U.S. patents, U.S. patent application publications, U.S. patent applications, foreign patents, foreign patent applications and non-patent publications referred to in this specification are incorporated herein by reference, in their entirety. Aspects of the embodiments can be modified, to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method, comprising:
    forming, in a first semiconductor body, a buried cavity and a membrane suspended over the buried cavity;
    forming, in a second semiconductor body, a recess;
    coupling the second semiconductor body to the first semiconductor body so that the recess faces the membrane, thus defining a sealed cavity having an internal pressure value that provides a pressure-reference value; and
    forming a channel at least in part in the first semiconductor body and in fluidic communication with the buried cavity.

2. The method according to claim 1, further comprising forming a transducer assembly in a surface region of the membrane facing inside of the sealed cavity, the transducer assembly being configured to generate a transduced electrical signal as a function of a deflection of the membrane.

3. The method according to claim 1, wherein forming the buried cavity and forming the channel in the first semiconductor body are performed simultaneously.

4. The method according to claim 1, wherein forming the channel comprises:
    etching the first semiconductor body as partial prolongation of the buried cavity, in a same plane as the buried cavity; and
    cutting the first semiconductor body for exposing the channel at a side wall, orthogonal to the plane, of the first semiconductor body.

5. The method according to claim 1, wherein forming the channel comprises:
    etching the first semiconductor body as partial prolongation of the buried cavity in a first direction belonging to a plane of the buried cavity, to form a first subchannel; and
    etching the first semiconductor body in a second direction orthogonal to the first direction, for connecting the first subchannel fluidically with a side of the first semiconductor body exposed towards an external environment, to form a second subchannel.

6. The method according to claim 5, wherein manufacturing includes:
    forming a coupling region that surrounds the membrane completely; and
    hermetically coupling together the first and second semiconductor bodies via the coupling region, wherein forming the second subchannel comprises etching the first semiconductor body outside the coupling region.

7. The method according to claim 1, wherein forming the channel comprises:
    etching the first semiconductor body as partial prolongation of the buried cavity, along a first direction belonging to a plane of the buried cavity, to form a first subchannel;
    etching the first semiconductor body along a second direction orthogonal to the first direction, for connecting the first subchannel fluidically with a side of the first semiconductor body facing the second semiconductor body, to form a second subchannel; and
    etching the second semiconductor body to form a through hole fluidically connected to the buried cavity via the first and second subchannels.

8. The method according to claim 7, wherein manufacturing includes:
    forming a coupling region that surrounds the membrane completely;
    forming a through hole in the coupling region; and
    hermetically coupling together the first and second semiconductor bodies via the coupling region, wherein forming the second subchannel comprises etching the first and second semiconductor bodies in an area corresponding to the through hole of the coupling region.

9. The method according to claim 1 wherein forming the membrane and the buried cavity comprise:
    etching first trenches in the first semiconductor body, the first trenches delimiting between them first walls of semiconductor material;
    growing epitaxially, starting from the first walls, a closing layer of semiconductor material, said closing layer closing the first trenches at the top to form the membrane; and
    carrying out a thermal treatment such as to cause migration of the semiconductor material of the first walls and forming the buried cavity.

10. The method according to claim 9, wherein:
    forming the channel comprises etching second trenches in the first semiconductor body, as partial prolongation of the first trenches, the second trenches delimiting between them second walls of semiconductor material;
    growing the closing layer epitaxially further comprises closing the second trenches at the tops of the second trenches; and
    carrying out the thermal treatment further comprises causing migration of the semiconductor material of the second walls and forming the channel.

11. A method, comprising:
    forming a first group of discrete recesses on a first surface of a first substrate of a first material, the first group of discrete recesses arranged within a first area of the first surface and being separated from one another by a first substrate column;
    forming a layer over the first surface and covering the first group of discrete recesses and the first substrate column;

after the forming the layer, forming a buried cavity in the first substrate by annealing the first substrate such that the first substrate column at least partially dissolves due to atoms of the first material migrating;

forming a recess on a second surface of a second substrate, the recess having an opening at the second surface, the opening having a size that is larger than the first area;

coupling the second surface of the second substrate with the first surface of the first substrate such that the opening of the recess is fully overlapped by the first substrate and such that the opening of the recess overlaps the first area; and forming a channel at least in part in the first substrate and in fluidic communication with the buried cavity.

12. The method of claim 11, wherein the forming the layer is conducted in a deoxidizing environment.

13. The method of claim 12, wherein the deoxidizing environment includes hydrogen.

14. The method of claim 13, wherein the forming the layer traps the hydrogen of the deoxidizing environment within the first group of discrete recesses covered by the layer.

15. The method of claim 14, wherein the annealing is conducted in a hydrogen containing environment.

16. The method of claim 11, wherein the layer includes a same first material as the first substrate.

17. The method of claim 11, further comprising:

forming a second group of discrete recesses on a second area of the first surface that is adjacent to the first area, the second group of discrete recesses being separated from one another by a second substrate column, the second group of discrete recesses being separated from one or more discrete recess in the first group of discrete recesses by a third substrate column, and wherein the annealing the first substrate at least partially dissolves the second substrate column and the third substrate column such that a first channel is formed through the second group of recesses which communicates with a buried space formed through the first substrate column at least partially dissolving.

18. The method of claim 17, further comprising forming a second channel through the second substrate and connecting to the first channel.

19. A method, comprising:

coupling a first substrate with a second substrate, the first substrate having a buried cavity underneath a membrane on a first surface of the first substrate, the buried cavity being fully encapsulated, the second substrate having a recess opening only through a second surface of the second substrate, the first surface facing the second surface, and the recess fully encapsulated at least partially by the first substrate; and after the coupling, opening a channel in fluidic communication with the buried cavity.

20. The method of claim 19, further comprising forming a getter layer on a bottom surface of the cavity before the coupling.

* * * * *

UNITED STATES PATENT AND TRADEMARK OFFICE
CERTIFICATE OF CORRECTION

Page 1 of 1

PATENT NO.        : 10,962,431 B2
APPLICATION NO.   : 16/220498
DATED             : March 30, 2021
INVENTOR(S)       : Enri Duqi It is certified that error appears in the above-identified patent and that said Letters Patent is hereby corrected as shown below:

On the Title Page

Item [56], insert:
--204085748   U   01/07/15   CN
101331080    A   12/24/08   CN
101248340    A   08/20/08   CN
102749159    A   10/24/12   CN--.

In the Claims

Column 10, Line 42, Claim 9:
"semiconductor material, said" should read, --semiconductor material, the--.

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*